(12) United States Patent
Nishijima

(10) Patent No.: US 11,719,663 B2
(45) Date of Patent: Aug. 8, 2023

(54) MEASURING APPARATUS

(71) Applicant: HIOKI E.E. CORPORATION, Nagano (JP)

(72) Inventor: Katsutoshi Nishijima, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 0 days.

(21) Appl. No.: 17/455,081

(22) Filed: Nov. 16, 2021

(65) Prior Publication Data

US 2022/0155250 A1 May 19, 2022

(30) Foreign Application Priority Data

Nov. 19, 2020 (JP) ................................. 2020-192748

(51) Int. Cl.
*G01N 27/22* (2006.01)
(52) U.S. Cl.
CPC .................................. *G01N 27/228* (2013.01)
(58) Field of Classification Search
USPC .......................... 324/658, 660–663, 714–718
See application file for complete search history.

(56) References Cited

U.S. PATENT DOCUMENTS

| | | |
|---|---|---|
| 4,748,400 A | 5/1988 | Typpo |
| 4,795,965 A | 1/1989 | Dooley |
| 7,940,038 B2 * | 5/2011 | Da Silva ............ G01N 33/2823 324/715 |
| 2003/0109798 A1 | 6/2003 | Kermani |
| 2007/0240509 A1 * | 10/2007 | Uchiyama ............. G01P 15/125 73/514.32 |

(Continued)

FOREIGN PATENT DOCUMENTS

JP 2006-242718 A 9/2006

OTHER PUBLICATIONS

Extended European Search Report dated Apr. 20, 2022 for corresponding European Application No. 21208663.1.

(Continued)

*Primary Examiner* — Vincent Q Nguyen
(74) *Attorney, Agent, or Firm* — Pearne & Gordon LLP

(57) ABSTRACT

To provide a measuring apparatus that can detect a wide range of capacitance values with high sensitivity. The measuring apparatus includes an alternating-current signal generator that generates N (where N is a natural number not less than 2) detection alternating-current signals with different frequencies, a superpositioner that superposes the N detection alternating-current signals, multiplication processors that respectively multiply the N detection alternating-current signals with different frequencies by a measurement alternating-current signal output from a device under test to which a detection alternating-current signal obtained through the superposition has been applied, thereby obtaining N synchronous detection signals, low-pass filter processors that perform a low-pass filter process on the N synchronous detection signals to obtain N direct-current voltage signals, and a capacitance measurer that measures as the capacitance value of the device under test a capacitance value corresponding to the voltage values of the N direct-current voltage signals.

7 Claims, 6 Drawing Sheets

(56) References Cited

U.S. PATENT DOCUMENTS

| | | | |
|---|---|---|---|
| 2013/0176039 A1* | 7/2013 | Lamesch | H03K 17/955 324/683 |
| 2015/0097584 A1 | 4/2015 | Kremin et al. | |
| 2016/0195484 A1* | 7/2016 | Emery | G01R 27/16 702/65 |
| 2019/0286261 A1 | 9/2019 | Neel et al. | |

OTHER PUBLICATIONS

Shun Shijie et al., "Signal Demodulation Methods for Electrical Tomography: A Review", Oct. 15, 2019, pp. 9026-9035; XP011746681.

R.J. Yerworth et al., "Electrical impedance tomography spectroscopy (EITS) for human head imaging", May 1, 2003, pp. 477-489, XP020073695.

\* cited by examiner

MEASURING APPARATUS

CROSS-REFERENCE TO RELATED APPLICATIONS

This application claims the benefit of Japanese Application No. 2020-192748, filed on Nov. 19, 2020, the entire disclosure of which is hereby incorporated herein by reference.

BACKGROUND OF THE INVENTION

Field of the Invention

The present disclosure relates to a measuring apparatus and, for example, relates to a measuring apparatus that can measure the capacitance of a device under test by applying a voltage to the device and measuring a current through the device.

Description of the Related Art

Japanese Patent Laid-Open No. 2006-242718 describes an impedance detection device used for concurrently detecting the c component and the r component between the gate and the source of a transistor, and obtaining their values. The impedance detection device includes an alternating-current signal generator for applying an alternating-current signal to a detection target, a converter that converts a current generated in accordance with the impedance of the detection target into a voltage, and a synchronous detector that performs synchronous detection on an output signal of the converter to detect a first component that is one of the c component, the l component, and the r component of the detection target. In addition, Japanese Patent Laid-Open No. 2006-242718 describes that performing synchronous detection on an output signal, which has been obtained by subtracting the first component from the output signal of the converter to reduce the first component, can accurately detect impedance.

SUMMARY OF THE INVENTION

As a device that measures the impedance of a target, a device such as the one illustrated in FIG. 5 is also known. The measuring apparatus illustrated in FIG. 5 includes a signal source 101, a frequency divider 102, a waveform shaping filter 103, an output impedance adjustment circuit 104, terminals 105 and 107, a current-voltage converter 108, an amplifier 109, a multiplier 110, a low-pass filter 111, and a capacitance measuring instrument 112. It should be noted that FIG. 5 illustrates a state in which the measuring apparatus is connected to a device 106 under test via the terminals 105 and 107.

In the measuring apparatus illustrated in FIG. 5, an alternating-current signal with a predetermined frequency generated by the signal source 101, the frequency divider 102, and the waveform shaping filter 103 is applied to the device 106 under test via the terminal 105. An output signal from the device 106 under test is obtained with the terminal 107, and then, synchronous detection is performed on the signal with the multiplier 110. Further, the capacitance measuring instrument 112 detects the voltage value of the signal subjected to synchronous detection, thereby measuring the capacitance value of the device under test.

With such a measuring apparatus, a wider variety of devices under test have come to be measured in recent years. Thus, it is desired that the capacitance value that has conventionally been not supposed to be measured be included in the measurement target. However, since the device 106 under test is often configured as a parallel circuit of insulation resistance and parasitic capacitance, it is obvious that simply increasing the range of capacitance values to be measured of the device under test would not be an adequate solution.

In such a measuring apparatus, if the value of the parasitic capacitance of the device 106 under test is as small as outside the range that has been conventionally supposed, as illustrated in FIG. 6, different voltage values are detected corresponding to the same capacitance depending on the magnitude of the insulation resistance. As illustrated in FIG. 7, such an influence appears as a difference of 85% or more at a maximum in a region where the capacitance is small. Consequently, when the device 106 under test, which has parasitic capacitance with a value as small as outside the range that has been conventionally supposed, is the detection target, measurement accuracy would decrease.

Meanwhile, in such a measuring apparatus, if the value of the parasitic capacitance of the device 106 under test is as large as outside the range that has been conventionally supposed, the influence of contact resistance between the terminals 105 and 107 and the terminals of the device 106 under test appears as an error of a detected voltage value. To cancel out such an influence of contact resistance, it may be effective to set the capacitance value of the output impedance of an alternating-current signal to be larger than the conventional one. However, in such a case, the detected voltage level with respect to the capacitance value would decrease. This results in decreased measurement accuracy.

As described above, if the capacitance value is outside the range that has been conventionally supposed, it is considered that measurement accuracy would decrease both in the region where the capacitance value is small and the region where the capacitance value is large. Consequently, regarding the device 106 under test of the conventional measuring apparatus, if the capacitance values outside the range that has been conventionally supposed are included in the measurement target, detection sensitivity becomes nonuniform as illustrated in FIG. 8. Therefore, if the range of capacitance values to be measured of the device under test is increased so as to allow the capacitance values outside the range that has been conventionally supposed to be included in the measurement target, measurement accuracy would decrease.

The present disclosure is related to providing a measuring apparatus that can detect a wide range of capacitance values with high sensitivity.

A measuring apparatus according to a representative embodiment of the present disclosure includes an alternating-current signal generator that generates N (where N is a natural number not less than 2) detection alternating-current signals with different frequencies, a superpositioner that superposes the N detection alternating-current signals, an output terminal that outputs to a device under test a detection alternating-current signal obtained through the superposition, an input terminal that receives a measurement alternating-current signal output from the device under test to which the detection alternating-current signal obtained through the superposition has been applied, a multiplication processor that multiplies the measurement alternating-current signal by the N detection alternating-current signals with different frequencies, thereby obtaining N synchronous detection signals, a low-pass filter processor that performs a low-pass filter process on the N synchronous detection signals, thereby obtaining N direct-current voltage signals,

DETAILED DESCRIPTION OF THE PREFERRED EMBODIMENTS

1. Outline of Embodiment

Figure 1:
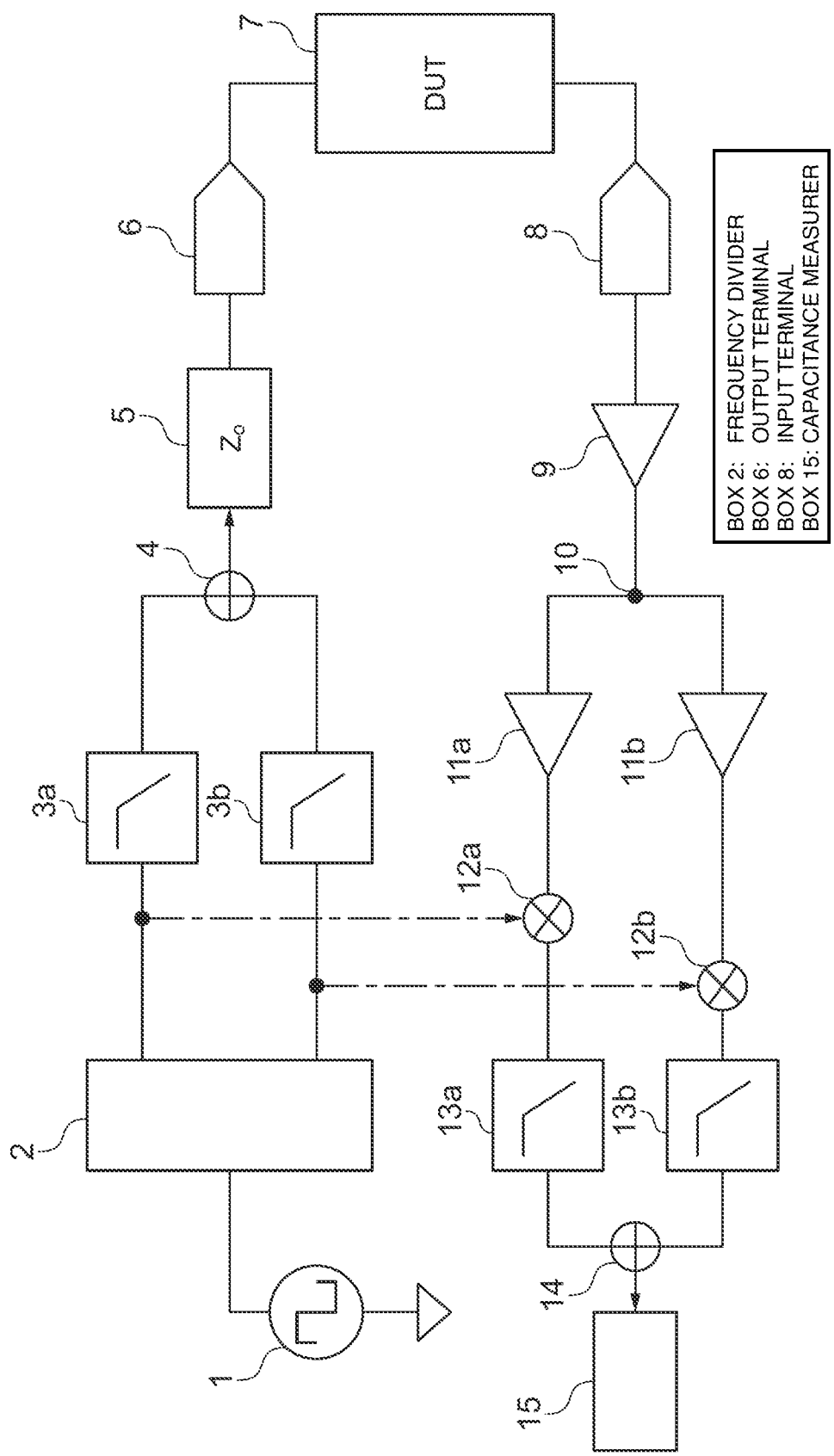
FIG. 1 is a diagram illustrating the configuration of a measuring apparatus according to an embodiment.

First, a outline of a representative embodiment of the disclosure of the present application will be described. It should be noted that in the following description, reference signs on the drawings corresponding to the elements of the disclosure in FIG. 1 are indicated in parentheses, for example.

[1] A measuring apparatus according to a representative embodiment includes an alternating-current signal generator (1, 2, 3a, 3b) that generates N (where N is a natural number not less than 2) detection alternating-current signals with different frequencies, a superpositioner (4) that superposes the N detection alternating-current signals, an output terminal (6) that outputs to a device (7) under test a detection alternating-current signal obtained through the superposition, an input terminal (8) that receives a measurement alternating-current signal output from the device (7) under test to which the detection alternating-current signal obtained through the superposition has been applied, a multiplication processor (12a, 12b) that multiplies the measurement alternating-current signal by each of the N detection alternating-current signals with different frequencies, thereby obtaining N synchronous detection signals, a low-pass filter processor (13a, 13b) that performs a low-pass filter process on the N synchronous detection signals, thereby obtaining N direct-current voltage signals, and a capacitance measurer (15) that measures as the capacitance value of the device under test a capacitance value corresponding to the voltage values of the N direct-current voltage signals.

According to such an aspect, it is possible to determine the capacitance value based on a plurality of detection alternating-current signals with different frequencies by applying to a device under test a signal obtained by superposing N detection alternating-current signals with different frequencies, multiplying the N detection alternating-current signals by a measurement alternating-current signal output from the device under test and performing a low-pass filter process on the resulting signals, thereby determining N direct-current voltage signals, and measuring as the capacitance value of the device under test a capacitance value corresponding to voltage values determined from the N direct-current voltage signals. Thus, a wide range of capacitance values can be detected with high sensitivity.

[2] In the measuring apparatus according to [1] above, the alternating-current signal generator may include N frequency signal generators including first to N-th frequency signal generators that respectively generate first to N-th detection alternating-current signals with first to N-th frequencies that are different from each other, and the superpositioner may superpose the first to N-th detection alternating-current signals generated by the first to N-th frequency signal generators.

According to such an aspect, as the N detection alternating-current signals generated in parallel by the N systems are superposed, there is no need to use a frequency divider. Thus, N detection alternating-current signals can be generated with a simple configuration.

[3] In the measuring apparatus according to [1] or [2] above, in an n-th (where n is an integer that changes from 1 to N) period, the multiplication processor may multiply the measurement alternating-current signal received from the input terminal by an n-th detection alternating-current signal, thereby obtaining an n-th synchronous detection signal, the low-pass filter processor may perform a low-pass filter process on the n-th synchronous detection signal to obtain an n-th direct-current voltage signal, and the capacitance measurer may measure a capacitance value from N direct-current voltage signals obtained in a first period to the N-th period in a time division manner.

According to such an aspect, as the N direct-current voltage signals are obtained by processing N detection alternating-current signals and a measurement alternating-current signal in a time division manner using the signal processor, there is no need to use two multiplication processors or two low-pass filter processors. Thus, the configuration can be simplified.

[4] In the measuring apparatus according to any one of [1] to [3] above, the capacitance measurer may detect the voltage values of the N direct-current voltage signals, and measure as the capacitance value of the device under test a capacitance value corresponding to the sum of the N detected voltage values.

According to such an aspect, as the direct-current voltage signals that are based on the N detection alternating-current signals are detected with N voltage detection circuits, there is no need to use a multiplexer. Thus, since the configuration related to the multiplexer and its peripheral circuits may be omitted, the configuration can be simplified.

[5] In the measuring apparatus according to any one of [1] to [3] above, the capacitance measurer may measure as the capacitance value of the device under test a capacitance value corresponding to the voltage value of a signal obtained by superposing the N direct-current voltage signals.

According to such an aspect, as the N direct-current voltage signals are superposed, it is only necessary to detect a voltage value that is based on the plurality of detection alternating-current signals only once. Thus, since only one voltage detection circuit is needed, the configuration can be simplified.

[6] In the measuring apparatus according to any one of [1] to [5] above, the alternating-current signal generator may set N different frequencies at which high-sensitivity regions do not overlap with each other, each high-sensitivity region being a region where the magnitude of fluctuation in the voltage value with respect to fluctuation in the capacitance value is greater than or equal to a predetermined value.

According to such an aspect, as the regions of a plurality of detection alternating-current signals where the magnitude of fluctuation in the voltage value with respect to fluctuation in the capacitance value is greater than or equal to a predetermined value are used such that the regions do not overlap with each other, it is possible to use the regions with high detection sensitivity without waste. Thus, the capacitance value can be detected with as wide a range of the regions with high detection sensitivity as possible.

[7] The measuring apparatus according to [5] above may further include an analog adding circuit that superposes the N direct-current voltage signals and outputs the resulting signal to the capacitance measurer.

According to such an aspect, the circuit size can be reduced in comparison with when a method of converting signals into digital signals with an AD converter and adding the signals together is used.

2. Specific Examples of Embodiment

Hereinafter, specific examples of an embodiment of the present disclosure will be described with reference to the accompanying drawings. It should be noted that in the following description, elements common to each embodiment are denoted by identical reference signs, and repeated description will be omitted. It should also be noted that the drawings are only schematic, and the dimensional relationship between elements, the proportions of elements, and the like in each drawing may differ from those in reality. In addition, different drawings may include portions with different dimensional relationships or proportions.

Embodiment

FIG. 1 is a diagram illustrating the configuration of a measuring apparatus according to an embodiment.

The measuring apparatus of the present embodiment measures the magnitude of the capacitance value of a device under test (DUT) 7 in a state in which an output terminal 6, which outputs a detection signal, and an input terminal 8, which inputs a signal from the device 7 under test to the measuring apparatus, are physically in contact with the device 7 under test. Based on the magnitude of the capacitance value measured by the measuring apparatus, it is possible to determine if the output terminal 6 and the input terminal 8 are electrically connected to the device 7 under test properly. For example, there may be a case where the two terminals 6 and 8 and the device 7 under test are not electrically or physically in contact with each other due to rust generated on the terminal portions of the device 7 under test, for example.

As illustrated in FIG. 1, the measuring apparatus includes, on the output side for the device 7 under test, a signal source 1, a frequency divider 2, two waveform shaping filters 3a and 3b, a multiplexer 4, an impedance adjustment circuit 5, and an output terminal 6. In addition, as illustrated in FIG. 1, the measuring apparatus includes, on the input side from the device 7 under test, the input terminal 8, a current-voltage converter circuit 9, a brancher 10, two amplifiers 11a and 11b, two multipliers 12a and 12b, two low-pass filters 13a and 13b, a multiplexer 14, and a capacitance measurer (capacitance measuring unit) 15. In this embodiment, as an example, the signal source 1 and the frequency divider 2 can constitute the alternating-current signal generator (alternating-current signal generation unit).

The signal source 1 is an oscillator that outputs an alternating-current signal with a specific frequency. Examples of the signal source 1 include, but are not limited to, a crystal oscillator that outputs an alternating-current signal with a frequency of 1 MHz as a specific frequency.

The frequency divider 2 converts the alternating-current signal with a specific frequency output from the signal source 1 into a signal with a frequency suitable for measuring the device 7 under test. As the frequency divider 2, an analog divider circuit can be used. The frequency divider 2 can convert the frequency of the signal source into two different frequencies f1 and f2, for example. As the two different frequencies f1 and f2, frequencies are selected that allow the value of the parasitic capacitance of the device 7 under test to be measured to be included in the measurement range, and such frequencies are set in advance.

The waveform shaping filters 3a and 3b are filters that shape the waveforms of the two alternating-current signals with different frequencies f1 and f2, which have been generated by the frequency divider 2, from rectangular waves into sine waves. As the waveform shaping filters 3a and 3b, band-limiting circuits can be used. Changing the waveforms of the alternating-current signals into sine waves with the waveform shaping filters 3a and 3b can facilitate detection.

The multiplexer (which is an example of a superpositioner: superposition unit) 4 multiplexes (superposes) the two alternating-current signals with different frequencies output from the two waveform shaping filters 3a and 3b into one alternating-current signal, and outputs the signal to the impedance adjustment circuit 5. As the multiplexer 4, an analog adding circuit can be used.

The impedance adjustment circuit 5 is a circuit that adjusts the output impedance of the alternating-current signal generated for detection so as to be able to output an alternating-current signal suited for the device 7 under test. As the impedance adjustment circuit 5, a circuit obtained by connecting a resistive element or a capacitive element can be used, for example.

The output terminal 6 is a signal output terminal connected to the input terminal of the device 7 under test. When the output terminal 6 is properly connected to the input terminal of the device 7 under test, the output terminal 6 outputs to the device 7 under test the alternating-current signal with the adjusted impedance as a detection alternating-current signal.

The input terminal 8 is an input terminal connected to the output terminal of the device 7 under test. When the input terminal 8 is properly connected to the output terminal of the device 7 under test, the input terminal 8 receives a measurement alternating-current signal output from the device 7 under test to which the detection alternating-current signal has been applied.

The current-voltage converter circuit 9 is a circuit that converts the current of the measurement alternating-current signal into a voltage. When the current-voltage converter circuit 9 convers the current into a voltage, the current of the measurement alternating-current signal can be detected as a voltage.

The brancher 10 branches the measurement alternating-current signal output from the current-voltage converter circuit 9 into two signals, and then inputs one of the signals to the first amplifier 11a, and inputs another signal to the second amplifier 11b.

Each of the two amplifiers 11a and 11b is an amplifier that amplifies a signal component with a predetermined frequency of the measurement alternating-current signal. The first amplifier 11a amplifies a signal component with the frequency f1 of the measurement alternating-current signal. The second amplifier 11b amplifies a signal component with the frequency f2 of the measurement alternating-current signal.

The two multipliers (which are examples of multiplication processors) 12a and 12b respectively multiply the measurement alternating-current signals with the signal components with the predetermined frequencies amplified by the two amplifiers 11a and 11b by the detection alternating-current signals with the corresponding frequencies f1 and f2, thereby obtaining two synchronous detection signals. The first multiplier 12a can obtain a synchronous detection signal by multiplying the measurement alternating-current signal with the amplified signal component with the frequency f1 by the detection alternating-current signal with the frequency f1. The second multiplier 12b can obtain another synchronous detection signal by multiplying the measurement alternating-current signal with the amplified signal component with the frequency f2 by the detection alternating-current signal with the frequency f2. That is, synchronous detection signals with two frequencies f1 and f2 can be obtained with the two multipliers 12a and 12b.

The two low-pass filters (which are examples of low-pass filter processors) 13a and 13b are filters that respectively perform a low-pass filter process on the two synchronous detection signals, thereby obtaining two direct-current voltage signals. The low-pass filter process is a process of passing only frequency components of less than frequencies f1' and f2' corresponding to the frequencies f1 and f2 used for synchronous detection. With the two low-pass filters 13a and 13b, it is possible to remove alternating-current ripples and extract direct-current signal components needed for the measurement.

The multiplexer 14 multiplexes the two direct-current voltage signals, and inputs the resulting signal to the capacitance measurer 15. As the multiplexer 14, an analog adding circuit can be used.

The capacitance measurer 15 measures as the capacitance value of the device 7 under test a capacitance value corresponding to the voltage value of the direct-current voltage signal received from the multiplexer 14. The capacitance measurer 15 can determine the capacitance value corresponding to the voltage value of the direct-current voltage signal, which has been obtained through multiplexing, based on the capacitance vs. detected voltage characteristics. The capacitance vs. detected voltage characteristics are represented by a fitting curve that is determined according to the characteristics (e.g., predetermined insulation resistance) of the device 7 under test estimated as a measurement target. The capacitance vs. detected voltage characteristics can be stored in a storage (not illustrated) of the measuring apparatus in advance. Although the capacitance vs. detected voltage characteristics may be stored in the storage of the measuring apparatus in advance before shipment from the factory, the capacitance vs. detected voltage characteristics may be updated at any point in time after shipment from the factory.

Hereinafter, the capacitance vs. detected voltage characteristics used for determining the capacitance value corresponding to the voltage value of the direct-current voltage signal, which has been obtained through multiplexing, will be described.

Figure 2:
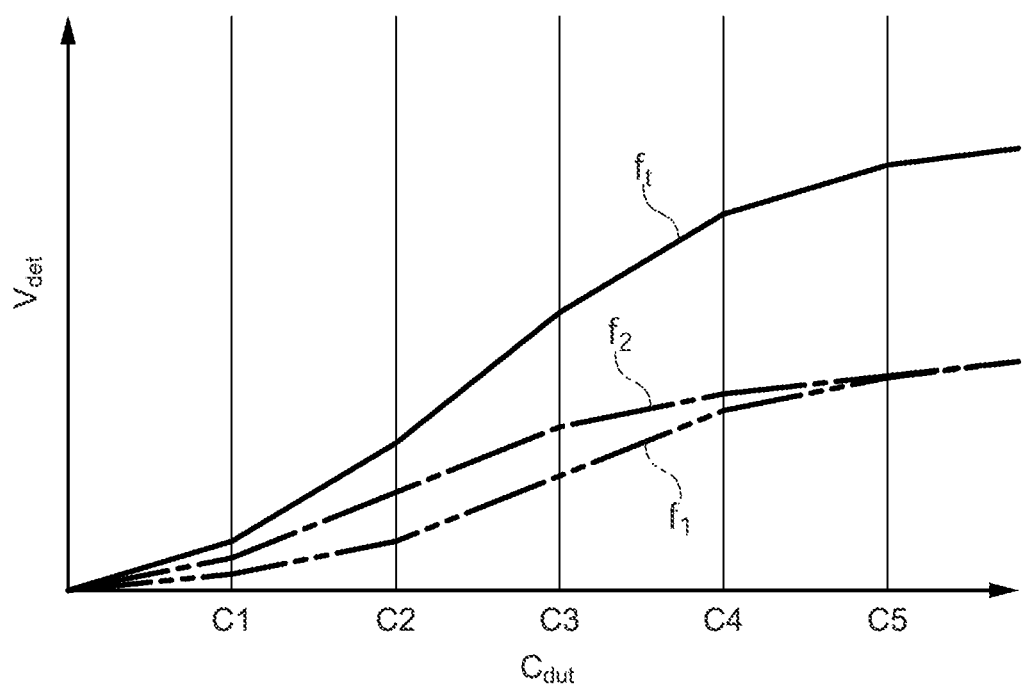
FIG. 2 is a chart illustrating the capacitance vs. detected voltage characteristics used in the measuring apparatus of the embodiment.

FIG. 2 is a chart illustrating the capacitance vs. detected voltage characteristics used in the measuring apparatus of the embodiment. Specifically, FIG. 2 illustrates capacitance vs. detected voltage characteristics $f_t$ used in the measuring apparatus of the embodiment, capacitance vs. detected voltage characteristics $f_1$ at a first frequency f1, and capacitance vs. detected voltage characteristics $f_2$ at a second frequency f2.

As illustrated in FIG. 2, the capacitance vs. detected voltage characteristics $f_t$ used in the measuring apparatus of the present embodiment are characteristics obtained by superposing the capacitance vs. detected voltage characteristics $f_1$ and $f_2$ at the two frequencies f1 and f2. Herein, the two frequencies f1 and f2 are equal to the frequencies f1 and f2 of the detection alternating-current signals generated by the frequency divider 2.

The capacitance measurer 15 can, upon detecting the voltage value of the signal obtained by adding together the two direct-current voltage signals, identify the capacitance value corresponding to the detected voltage value with reference to the capacitance vs. detected voltage characteristics $f_t$, and thus determine the identified capacitance value as the measured value.

Regarding the capacitance vs. detected voltage characteristics $f_1$ at the frequency f1, fluctuation in the voltage value with respect to fluctuation in the capacitance value is large in the period from a capacitance value C1 to a capacitance value C3. Thus, it can be said that detection sensitivity to the capacitance value C1 to the capacitance value C3 is high. Regarding the capacitance vs. detected voltage characteristics $f_2$ at the frequency f2, fluctuation in the voltage value with respect to fluctuation in the capacitance value is large in the period from a capacitance value C2 to a capacitance value C4. Thus, it can be said that detection sensitivity to the capacitance value C2 to the capacitance value C4 is high. Regarding the capacitance vs. detected voltage characteristics $f_t$ that are the superposed characteristics of the capacitance vs. detected voltage characteristics $f_1$ and $f_2$ at the two frequencies f1 and f2, the slope from C1 to C4 is relatively large as illustrated in FIG. 2. Thus, a region where the detection sensitivity is high is wider than when a single frequency is used. Therefore, according to the measuring apparatus of the present embodiment, it can be said that a wider range of capacitance values than that of the conventional art can be detected with high sensitivity.

The frequencies f1 and f2 used in the measuring apparatus of the present embodiment can be selected so as to allow desired capacitance values to be included in the region where the slope of the capacitance vs. detected voltage characteristics is steep. Further, as the frequencies f1 and f2, it is preferable to set frequencies at which high-sensitivity regions where the magnitude of fluctuation in the voltage value with respect to fluctuation in the capacitance value is greater than or equal to a predetermined value do not overlap with each other.

Figure 3:
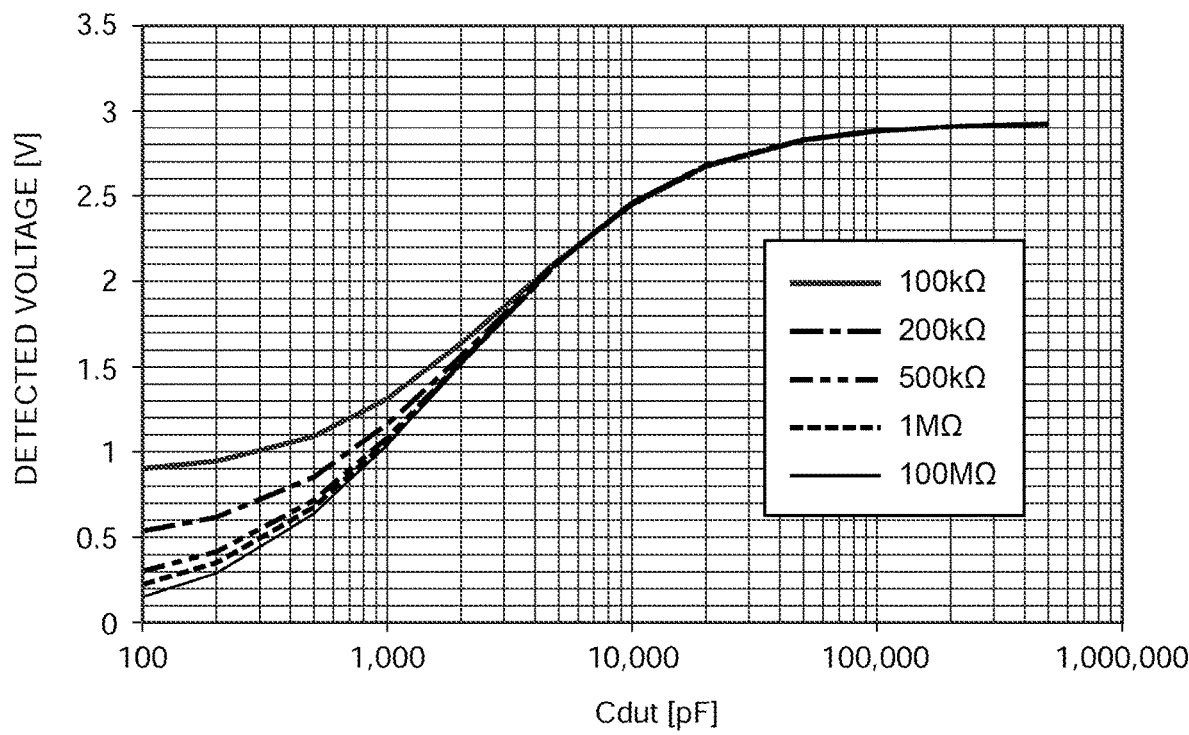
FIG. 3 is a chart illustrating changes in the capacitance vs. detected voltage characteristics for each of different insulation resistance values in the configuration of the measuring apparatus of the embodiment.
Figure 6:
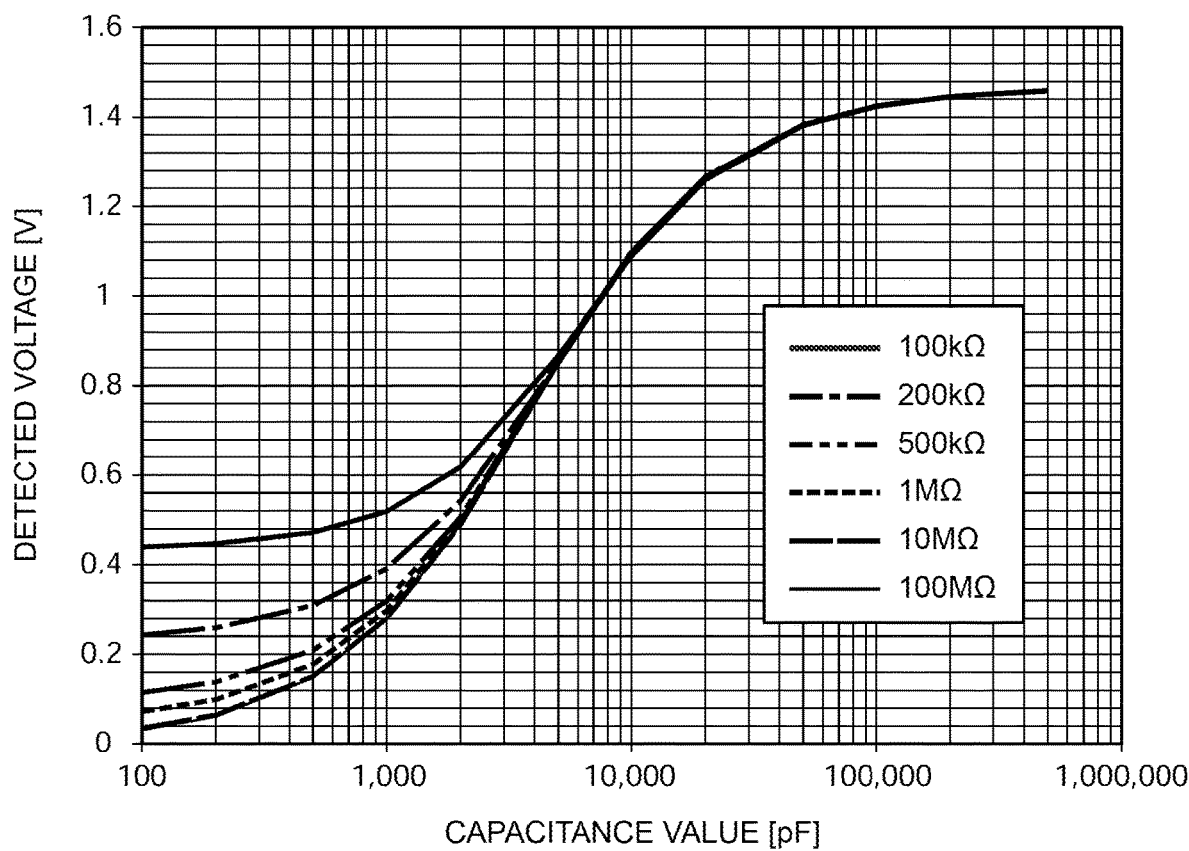
FIG. 6 is a chart illustrating the detection sensitivity of the conventional measuring apparatus.

FIG. 3 is a graph illustrating changes in the capacitance vs. detected voltage characteristics for each of different insulation resistance values in the configuration of the measuring apparatus of the embodiment. Specifically, FIG. 3 illustrates the capacitance vs. detected voltage characteristics when the insulation resistance value is 100 kΩ, 200 kΩ, 500 kΩ, 1 MΩ, and 100 MΩ. In the configuration of the measuring apparatus of the present embodiment, the difference among the capacitance vs. detected voltage characteristics depending on the insulation resistance value is also smaller in the low capacitance region as compared to that of the conventional measuring apparatus illustrated in FIG. 6.

Figure 4:
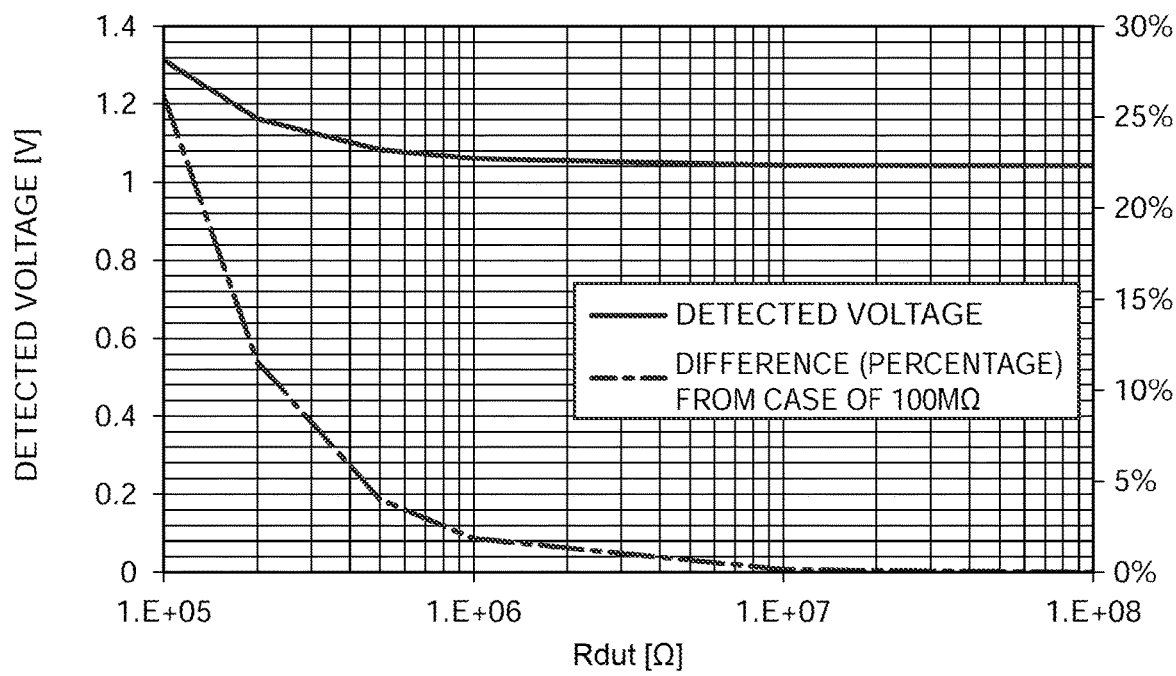
FIG. 4 is a chart illustrating the influence of the insulation resistance value on the measured voltage in the configuration of the measuring apparatus of the embodiment.
Figure 5:
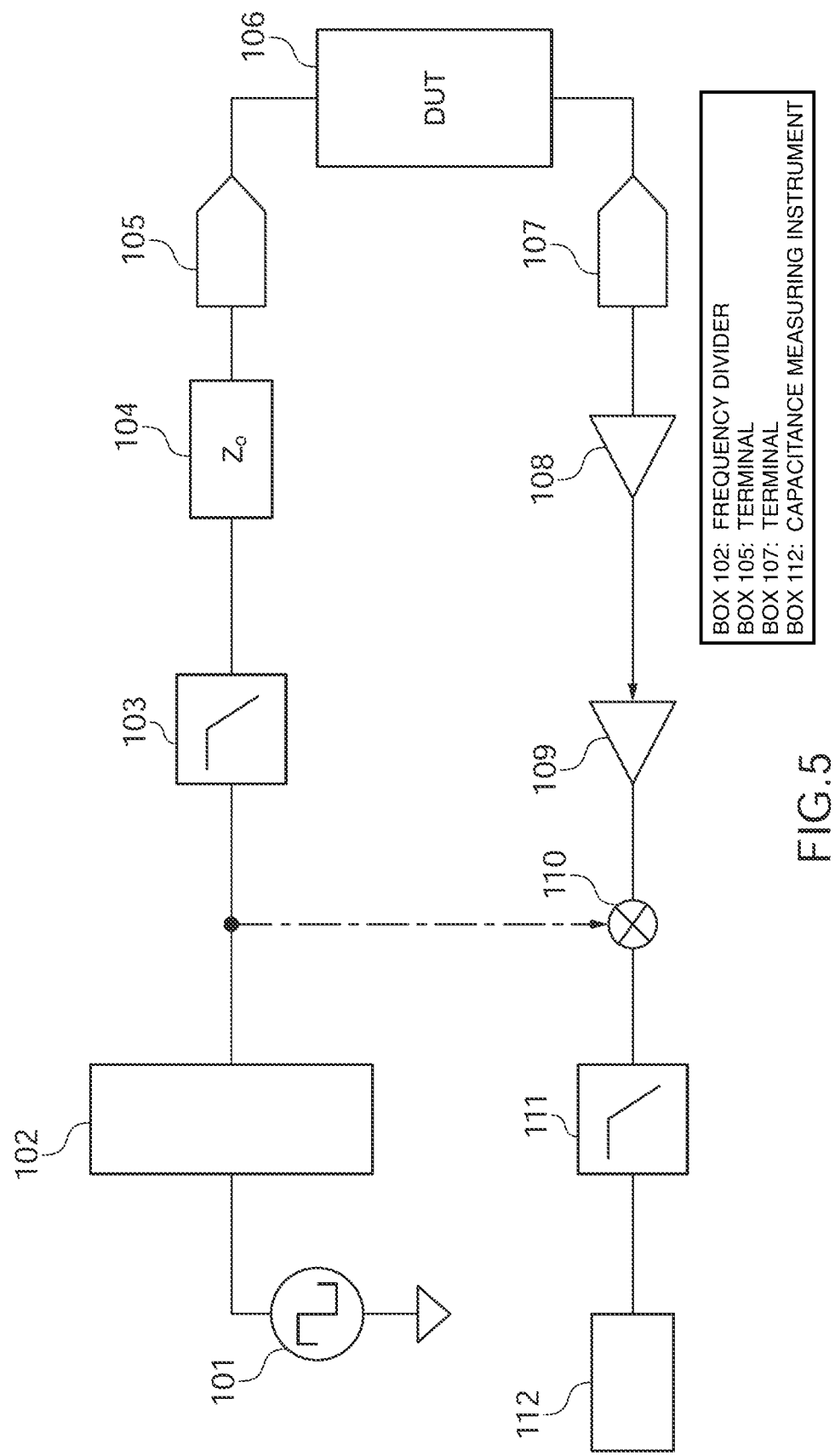
FIG. 5 is a diagram illustrating the configuration of a conventional measuring apparatus.
Figure 7:
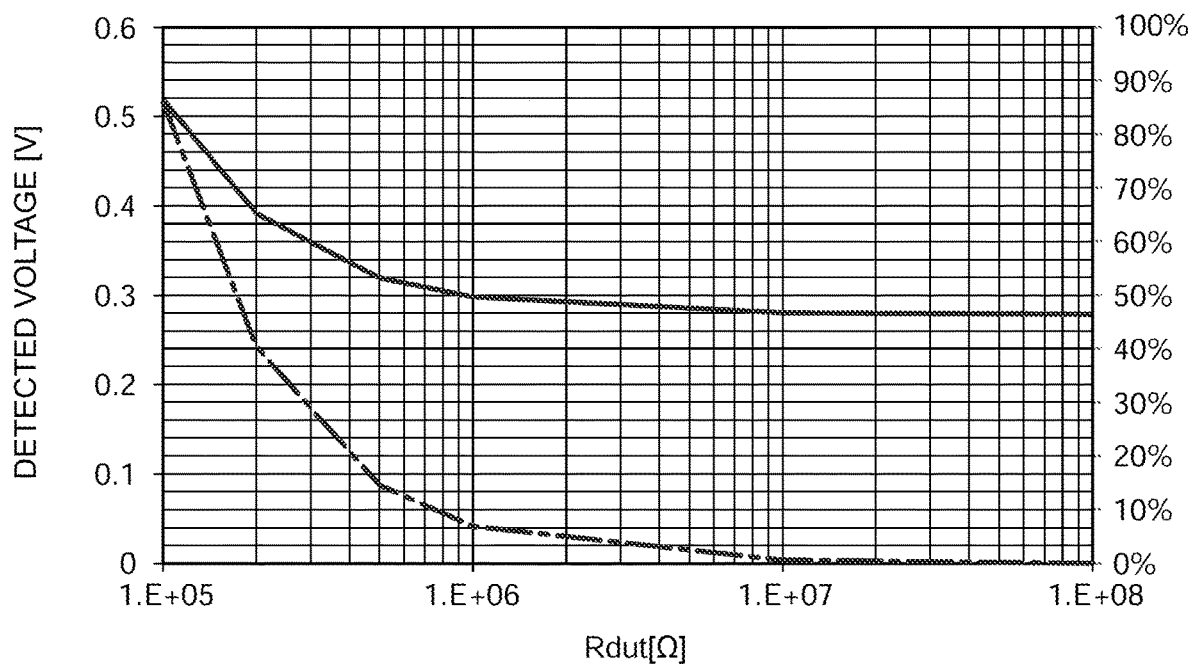
FIG. 7 is a chart illustrating changes in the capacitance vs. detected voltage characteristics for each of different insulation resistance values in the configuration of the conventional measuring apparatus.
Figure 8:
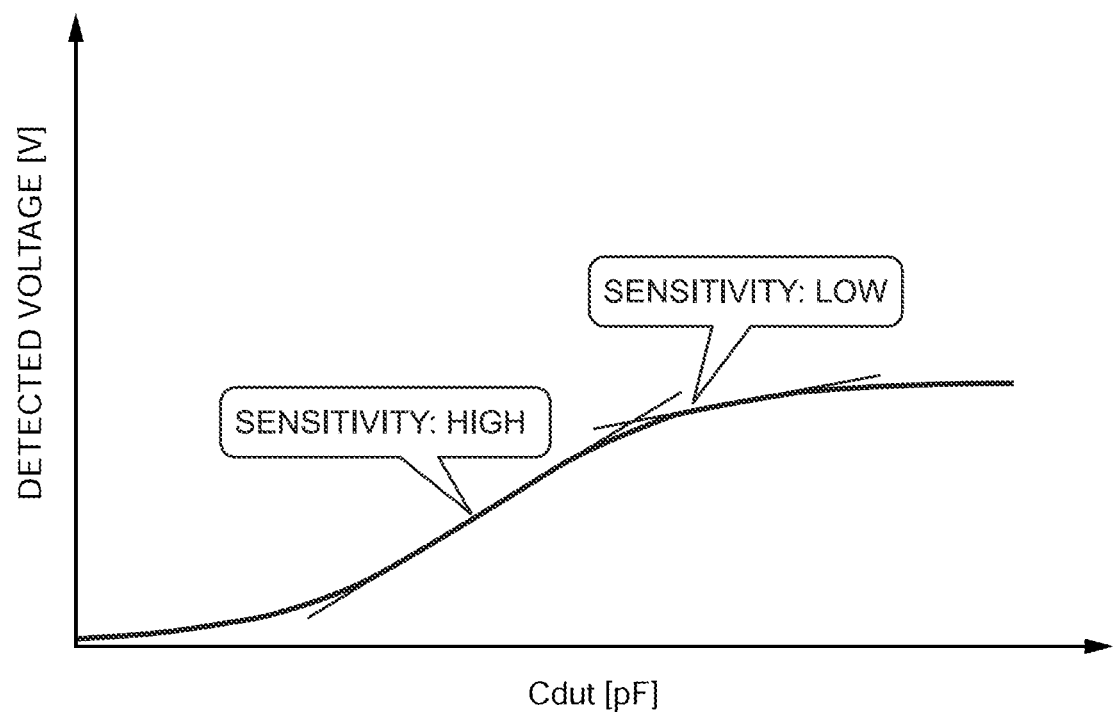
FIG. 8 is a chart illustrating the influence of the insulation resistance value on the measured voltage in the configuration of the conventional measuring apparatus.

FIG. 4 is a chart illustrating the influence of the insulation resistance value on the measured voltage in the configuration of the measuring apparatus of the embodiment. Specifically, FIG. 4 illustrates changes in the voltage detected when the capacitance value is 1 nF for each insulation resistance value, and the influence of the difference, expressed in percentage, between the voltage and the voltage detected when the insulation resistance value is 100 MΩ. In FIG. 4, the difference between the voltage detected when the capacitance value is 1 nF and the voltage detected when the insulation resistance is 100 MΩ is as small as 28% at a maximum. This is considered to not be an issue in practice as the influence of the insulation resistance is significantly smaller than that in the conventional measuring apparatus illustrated in FIG. 7 where the difference is 85% or more at a maximum.

As described above, according to the measuring apparatus of the present embodiment, the influence of insulation resistance can be suppressed more than that in the conventional measuring apparatus. Thus, it can be said that a wide range of capacitance values can be detected with high sensitivity.

Modified Example of Embodiment

Although the measuring apparatus of the embodiment has been described with reference to a specific example, the present disclosure is not limited to such an example, and a variety of modified forms can be adopted. For example, signals with different frequencies generated by the frequency divider 2 may be signals with two or more different frequencies. In such a case, as many waveform shaping filters 3a and 3b, as many amplifiers 11a and 11b, as many multipliers 12a and 12b, and as many low-pass filters 13a and 13b as the number of signals with different frequencies are provided.

In the aforementioned embodiment, measurement is performed by converting the current of a measurement alternating-current signal into a voltage using the current-voltage converter circuit 9, but the present disclosure is not limited to such a configuration. For example, it is also possible to directly measure the voltage of a measurement alternating-current signal from the device 7 under test by detecting a voltage across the output terminal 6 and the input terminal 8.

The configuration including analog circuits in the aforementioned embodiment may be provided using digital circuits. For example, it is possible to use an FPGA programmed to implement the functions of the brancher 10, the two amplifiers 11a and 11b, the two multipliers 12a and 12b, the two low-pass filters 13a and 13b, the multiplexer 14, and the capacitance measurer 15. Alternatively, instead of the FPGA, it is also possible to employ a configuration using a program processor (for example, a microcontroller: MCU) including a processor such as a CPU, various memories such as ROM and RAM, and hardware components such as a timer (i.e., a counter), an A/D converter circuit, an input-output I/F circuit, and a clock generation circuit that are connected via buses or dedicated wires. In such a case, the configuration of each of the aforementioned functional units can be implemented as the program processor performs various arithmetic operations in accordance with programs stored in a flash memory 21 such as a memory, and peripheral circuits such as the A/D converter circuit and the input-output I/F circuit are controlled.

In addition, in the aforementioned embodiment, N detection alternating-current signals are generated by dividing a signal output from the signal source 1 using the frequency divider 2, but the present disclosure is not limited to such a configuration. For example, N signal sources may be used to generate N detection alternating-current signals.

Further, in the aforementioned embodiment, the capacitance measurer 15 detects the voltage value of a signal obtained by adding together two direct-current voltage signals, and determines a capacitance value corresponding to the detected voltage value based on the capacitance vs. detected voltage characteristics ft, but the present disclosure is not limited to such a configuration. For example, the capacitance measurer 15 may detect the voltage values of the two direct-current voltage signals and measure as the capacitance value of the device 7 under test a capacitance value corresponding to the sum of the two detected voltage values.

Furthermore, in the aforementioned embodiment, an example has been described in which signals with two or more different frequencies are generated concurrently and are processed by two or more systems, but signals with two or more different frequencies may be generated in a time division manner and be processed in a time division manner. For example, the aforementioned measurement alternating-current signal is sequentially processed in a plurality of separate periods. In such a case, after the aforementioned measurement alternating-current signal is received, the processes performed by the brancher 10, the amplifiers 11a and 11b, the multipliers 12a and 12b, and the low-pass filters 13a and 13b are performed in a time division manner. Specifically, instead of the amplifiers 11a and 11b, the multipliers 12a and 12b, and the low-pass filters 13a and 13b, a signal processor (not illustrated) may be used. Such a signal processor performs a process of determining N direct-current voltage signals in a time division manner through digital signal processing or analog signal processing by, in an n-th (where n is an integer that changes from 1 to N) period, receiving waveform data on an n-th detection alternating-current signal and a measurement alternating-current signal, and multiplying the data on the n-th detection alternating-current signal by the data on the measurement alternating-current signal, and then performing a low-pass filter process on the resulting data through filtering. Then, the signal processor adds together the determined N direct-current voltage signals, and determines a capacitance value from the voltage value of the resulting signal. It should be noted that in the time division manner, the brancher 10 may be omitted as the aforementioned measurement alternating-current signal is processed in each time period. In addition, the amplifiers 11a and 11b may be provided either inside or outside of the signal processor.

REFERENCE SIGNS LIST

1 Signal source
2 Frequency divider
3a, 3b Waveform shaping filters
4 Multiplexer
5 Impedance adjustment circuit
6 Output terminal
7 Device under test
8 Input terminal
9 Current-voltage converter circuit 10 Brancher
11a, 11b Amplifiers
12a, 12b Multipliers
13a, 13b Low-pass filters
14 Multiplexer
15 Capacitance measurer
101 Signal source
102 Frequency divider
103 Waveform shaping filter
104 Output impedance adjustment circuit
105, 107 Terminals
106 Device under test
108 Current-voltage converter
109 Amplifier
110 Multiplier
111 Low-pass filter
112 Capacitance measuring instrument

What is claimed is:

1. A measuring apparatus comprising:
an alternating-current signal generator that generates N (where N is a natural number not less than 2) detection alternating-current signals with different frequencies;
a superpositioner that superposes the N detection alternating-current signals with different frequencies;
an output terminal that outputs to a device under test a detection alternating-current signal obtained through the superposition;
an input terminal that receives a measurement alternating-current signal output from the device under test to which the detection alternating-current signal has been applied;
a multiplication processor that multiplies the measurement alternating-current signal by a corresponding detection alternating-current signal among the N detection alternating-current signals with different frequencies, thereby obtaining N synchronous detection signals;
a low-pass filter processor that performs a low-pass filter process on the N synchronous detection signals, thereby obtaining N direct-current voltage signals; and
a capacitance measurer that measures as a capacitance value of the device under test a capacitance value corresponding to voltage values of the N direct-current voltage signals.

2. The measuring apparatus according to claim 1, wherein:
the alternating-current signal generator includes N frequency signal generator including first to N-th frequency signal generators that respectively generate first to N-th detection alternating-current signals with first to N-th frequencies that are different from each other, and
the superpositioner superposes the first to N-th detection alternating-current signals generated by the first to N-th frequency signal generators.

3. The measuring apparatus according to claim 1, wherein in an n-th (where n is an integer that changes from 1 to N) period:
the multiplication processor multiplies the measurement alternating-current signal received from the input terminal by the n-th detection alternating-current signal, thereby obtaining an n-th synchronous detection signal,
the low-pass filter processor performs a low-pass filter process on the n-th synchronous detection signal to obtain an n-th direct-current voltage signal, and
the capacitance measurer measures a capacitance value from N direct-current voltage signals obtained in a first period to the N-th period in a time division manner.

4. The measuring apparatus according to claim 1, wherein the capacitance measurer detects voltage values of the N direct-current voltage signals, and measures as the capacitance value of the device under test a capacitance value corresponding to a sum of the N detected voltage values.

5. The measuring apparatus according to claim 1, wherein the capacitance measurer measures as the capacitance value of the device under test a capacitance value corresponding to a voltage value of a signal obtained by superposing the N direct-current voltage signals.

6. The measuring apparatus according to claim 1, wherein the alternating-current signal generator sets N different frequencies at which high-sensitivity regions do not overlap with each other, each high-sensitivity region being a region where a magnitude of fluctuation in the voltage value with respect to fluctuation in the capacitance value is greater than or equal to a predetermined value.

7. The measuring apparatus according to claim 5, further comprising an analog adding circuit that superposes the N direct-current voltage signals and outputs a resulting signal to the capacitance measurer.

* * * * *